United States Patent
Mallinson

(10) Patent No.: US 7,349,491 B2
(45) Date of Patent: Mar. 25, 2008

(54) FREQUENCY SHAPING STREAM SIGNAL PROCESSOR

(75) Inventor: Andrew Martin Mallinson, Kelowna (CA)

(73) Assignee: ESS Technology, Inc., Fremont, CA (US)

(*) Notice: Subject to any disclaimer, the term of this patent is extended or adjusted under 35 U.S.C. 154(b) by 660 days.

(21) Appl. No.: 10/810,313

(22) Filed: Mar. 26, 2004

(65) Prior Publication Data

US 2004/0213364 A1    Oct. 28, 2004

Related U.S. Application Data

(60) Provisional application No. 60/458,903, filed on Mar. 28, 2003.

(51) Int. Cl.
*H04L 27/20* (2006.01)
(52) U.S. Cl. .................... 375/308; 375/295
(58) Field of Classification Search ............ 375/308, 375/295, 298, 300, 259, 260, 268, 269
See application file for complete search history.

(56) References Cited

U.S. PATENT DOCUMENTS 4,034,305 A * 7/1977 Sato .................. 329/308
5,801,654 A * 9/1998 Traylor .................. 341/144

* cited by examiner

*Primary Examiner*—Chieh M. Fan
*Assistant Examiner*—Jason Joseph
(74) *Attorney, Agent, or Firm*—Kenta Suzue; Haynes Beffel & Wolfeld LLP

(57) ABSTRACT

A signal processor has a plurality of channels, each channel configured to receive an input signal stream, to reduce the signal to a direct current signal and to process the signal according to the stream signal. Each channel also has a plurality of low pass filters configured to filter in-phase and quadrature-phase modulator outputs with a first low pass filter and to filter a reference quadrature signals, and a gain control configured to re-modulate gain adjusted output signals with the filtered quadrature signals. The processor further includes an inverter to invert the in-phase filtered reference signal and means to multiply the quadrature gain adjusted output signal.

4 Claims, 4 Drawing Sheets

FREQUENCY SHAPING STREAM SIGNAL PROCESSOR

BACKGROUND

Digital signal processing is well known and is used in a variety of products. A general purpose computer chip, commonly called a CPU (an acronym for "Central Processing Unit") may be configured to operate on data representative of a "signal" and those operations may correspond to meaningful operation upon that signal, such as, for example, to find the maximum excursion of that signal, or to find the maximum frequency component present in that signal. The word "signal" is used to indicate that the data represent a continuously varying parameter, such as a sound pressure or image brightness or other parameter that varies with time. Data representing the height of trees growing in a parkland is not a signal in this sense—it has no variation with time, it represents a snapshot of a particular height of the trees.

Some meaningful operations on signals are computationally expensive—many primitive operations are needed to complete the operation on the data. Fourier analysis (decomposition into frequency components) is one such example. For this reason special purpose processing elements have been designed—these are CPUs that are specialized to process data representing a signal and include hardware to simplify or optimize what would otherwise be time consuming operations on a general purpose CPU. Such specialized CPU's are referred to as DSP's an acronym for Digital Signal Processor.

In the detailed operation of a DSP device we may identify a further distinction: those DSP's devices that operate continuously and those that operate in a batch mode. For example, in performing a common operation called Fast Fourier Transform (FFT) a section of the digital signal is taken into an input buffer—a temporary store of a number of signal samples. An operation, typically of many steps, then proceeds to operate upon the section of the data present in the input buffer, finally creating a second collection of data elements that can be considered an output buffer of data now representing the frequency decomposition of the signal data present in the input buffer. Thus, this DSP has completed an operation in a batch mode—it is only necessary that the batch operation upon the input buffer be compete before a second input buffer has filled—the faster that the batch operation proceeds the better, since the DSP processor then has time to complete other potentially useful operations. Contrast this FFT example of a batch mode operation with the operation of a Finite Impulse Response (FIR) filter. This is a signal processing method well know in the art, where a weighted summation of the input signal over a period of time is created to represent an output signal. The output signal has a lower frequency variation than the input. For example, a weigh scale in a supermarket checkout may be a source of a digital data signal. It may output a digital number representing the weight on the pan at a rate of 100 samples (measurements) per second. If these digital numbers were displayed they would flicker at up to 100 times a second since the measurement returned is not identical to the $\frac{1}{10}$ of a gram each time. This would be disconcerting and it is desirable to present a number to the customer that is stable, free from flicker. To accomplish this, a FIR filter may be used. The FIR filter takes the last 10 measurements and sums them, then presents to the display $\frac{1}{10}^{th}$ of the sum. Each time a new number is available from the input digital signal the old number, taken ten samples ago, is lost and the new sample is added. Therefore, a new output of $\frac{1}{10}^{th}$ the sum of the last 10 inputs is available 100-times a second and this new output data has fewer flickers, less variation, since it is the average of the last 10 results.

This weigh scale FIR example shows a second and distinct mode of operation from the FFT example: specifically, the weigh scale FIR operates continually, it does not operate in batch mode. It is useful to note that it accepts a stream of input data samples and creates a stream of output data samples. Significantly, there is no difference in operation at each presentation of new data—there is no "control state" in the operation of the FIR. There is significant "control state" in the operation of the FFT. The presence of a complex control state may be taken to distinguish a Stream Signal Processor (SSP) from a more generic DSP: the SSP is executing the identical operation (or operations) per new input data sample, the non-stream processing DSP is executing a complex sequence of operations, possibly not even at the rate of new input data. In the known art the generic non-stream processing DSP has a "program counter". This is a state variable indicating where the machine operation is at this time in the "program". This known art program counter is an example of the more fundamental concept of a "control state" and it is the absence of a control state that distinguishes a Stream Signal Processor.

Many circuits exist for processing digital signals in a variety of products, including audio products, video products, personal computers and many useful products. Central processing units (CPUs) are one example. CPUs, much like those used in personal computers and other applications, can be configured to process digital signals. In audio applications, however, cost and size are principal factors. CPUs demand a high cost, and consume relatively high power for audio applications.

Digital signal processors (DSPs), are an example of a more specialized, optimized and cost effective alternative to CPUs, as they are configured to process digital signals in particular. The DSPs still perform instruction decoding, interrupt logic operations, and other operations required of a CPU, but more specialized and optimized. DSPs, however, are still expensive relative to the cost of modern audio products. Like CPUs, DSPs require random access memory (RAM), read-only memory (ROM) and any associated support components. DSPs are more favorable to CPUs because DSPs optimize the CPU components, are less expensive, and consume less power. The competition in audio products are so great, that further refinement and optimization are required to further improve audio products and make their components and, thus, the final product more cost effective and consume less power.

Therefore, there exists a need for a further refined and improved alternative to CPUs and DSPs to make audio products less expensive, require less power, and yet still be functionally feasible. As described below, the invention provides a novel and elegant alternative.

DETAILED DESCRIPTION

Figure 1:
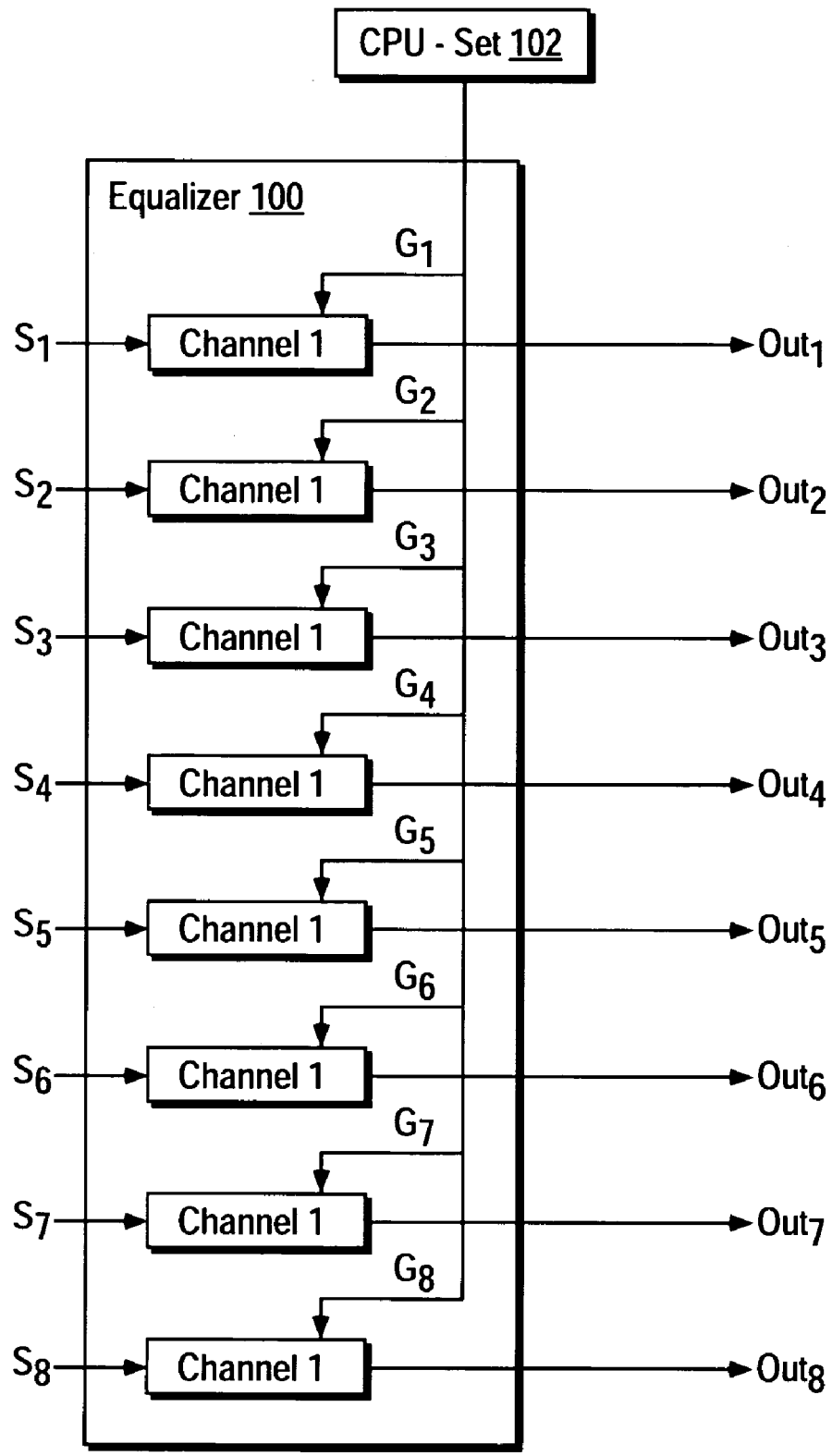
FIG. 1 is a diagrammatic view of an equalizer composed of a series of channels configured according to the invention.

The invention provides an alternative to DSPs and CPUs by providing circuits that further refine both conventional solutions. The signal processor (SSP) provides processing of data streams through special purpose stream signal processing elements, such as a Fourier analyzer, that process the streamed signal as it is received. Unlike conventional approaches, the SSP operates on the digital data signal as a stream of data, not on any discrete block of the data itself. CPUs and DSPs operate on the data of the incoming signals, requiring many complex and expensive components, which are substantially obviated by the invention. The invention is directed to processing the signal streams rather than the data. This allows the circuits to be greatly optimized, reducing their cost and power consumption, two factors of monumental impact on the cost and performance of products that utilized such circuits. In one embodiment of the invention, the data is received in as a serial stream, which is processed and subsequently streamed out. The process is continuous, for each input data item an output data item is created, data streams in and streams out at the same rate.

In operation, a method of processing an input signal by correlating the input signal with quadrature sources is provided. First, an input signal is received and is modulated with a quadrature sinusoidal source operating at the center frequency of the desired pass band. Next, the resulting in-phase and quadrature-phase modulator outputs is filtered with a low pass filter. The reference quadrature signals are filtered with a similar low pass filter. The amplitude of the in-phase and quadrature-phase modulator outputs is adjusted with a gain controlling circuit or multiplier. The gain adjusted output signals are then modulated by multiplying the filtered quadrature signals. This is done by using the quadrature filtered reference signal to multiply the in-phase gain adjusted output signal and using an inverted (multiplied by −1) version of the in-phase filtered reference signal to multiply the quadrature gain adjusted output signal. The resulting two outputs are them summed to generate an output signal.

A device is provided embodied in a signal processor that includes a plurality of channels, where each channel is configured to receive an input signal stream. This reduces the signal to a direct current signal. The processor is configured to process the signal according to the stream signal. Each channel has a plurality of low pass filters configured to filter in-phase and quadrature-phase modulator outputs with a first low pass filter. The processor further includes a filter for filtering a reference quadrature signals and a gain control configured to re-modulate gain adjusted output signals with the filtered quadrature signals. An inverter is configured to invert the in-phase filtered reference signal. The processor multiplies the quadrature gain adjusted output signal and a modulated signal is generated or outputted. In one embodiment, each channel includes an oscillator configured to establish the center of the bandpass of the channel. In another embodiment, each channel includes a gain input configured to receive a gain signal used to attenuate the channel signal.

Referring to FIG. 1, the embodiment of an equalizer composed of a series of stream signal processor (SSP) channels 1-8 is illustrated. Each channel includes a gain input $G_i$ and a signal input $S_i$. The only purpose for the system CPU 102 is to set the gain of the circuit by sending a gain setting signal to gain inputs $G_1$ through $G_8$. According to the invention, the equalizer then processes the stream signal, without needing a CPU to process the signal. Therefore, no software is required to process the incoming signals $S_1$ through $S_8$. Each of these gain inputs receives a control signal that sets the amplitude response to the circuit. These are represented as the gain "sliders" of the equalizer. The gain may be preset, or may be set by a user of the system by equalizer adjust control knobs or slide switches. The outputs, $Out_1$ through $Out_i$ are configured to transmit an output signal from each: of the SSP channels 1-8.

Figure 2:
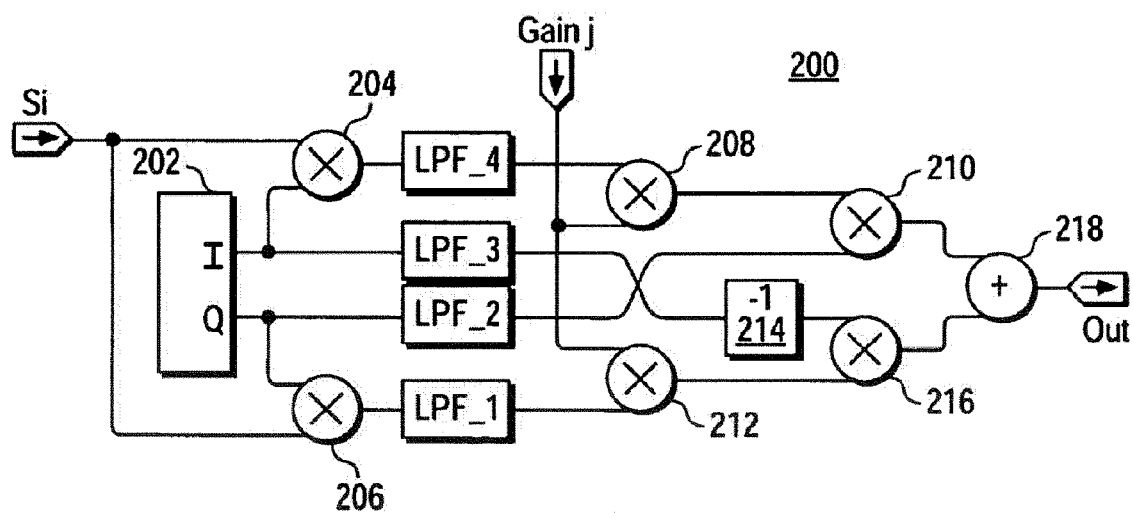
FIG. 2 is a diagrammatic view of one channel of the equalizer of FIG. 1.

Referring to FIG. 2, a more detailed illustration of a channel 200, one of SSP channels 1-8 of FIG. 1, is illustrated. The channel includes an input signal $S_i$ and an output $Out_i$. The channel operates to calculate the correlation of the input signal $S_i$ with quadrature sources. The term "quadrature source" is known in the art and refers to two sinusoidal signals out of phase by 90 deg. (ie so called "in quadrature") The two signals are commonly named the "I" and the "Q" signal. The IQ oscillator 202 is connected to multipliers 204 and 206 and to the low pass filters (LPF) $LPF_1$ and $LPF_2$ to provide a reference signal at the channel center frequency. The low pass filters $LPF_1$ and $LPF_2$ establish the bandpass width of the channel. The multipliers 204, 206 multiply the incoming signal by the respective outputs, I and Q, of the oscillator, and outputs the result to LPF_4 and LPF_1 respectively. The gain control $Gain_i$ attenuates the channel signal according to the gain input from the CPU or the user controls. The attenuated signal is re-modulated back to the base band by the final set of modulators 210, 216. The output of LPF_4 is multiplied by the gain input $Gain_i$ in multiplier 208. The output of multiplier 208 is then multiplied by the LPF_2 output in multiplier 210. Similarly, the output of multiplier 206 is input to LPF_1, and the output of LPF_1 is multiplied by the gain signal $Gain_i$ in multiplier 212. The output 212 is then multiplied by the output of LPF_3 in multiplier 216. The output signal from LPF_3 is inverted 90 degrees by inverter 214 before it is multiplied in multiplier 216. This operation compensates for the lack of suppression of the alias signal out of the modulator. (Commonly, the output of a quadrature modulator such as described here requires a filter to suppress the harmonics that are generated by the action of multiplying the oscillator signal and the input signal). The resulting remodulated outputs of multipliers 210 and 216 are then added together in adder 218 to give the equalizer output. In one embodiment of the invention, all arithmetic operations within the channel follow SSP methodology. However, the invention is not limited to SSP technology, and may encompass other technologies. In one embodiment, a combination of 16 and 32 bit data quantities may be implemented. A designer may choose to vary the size of the quantities in different applications according to certain required noise levels without departing from the spirit and scope of the invention.

Figure 3:
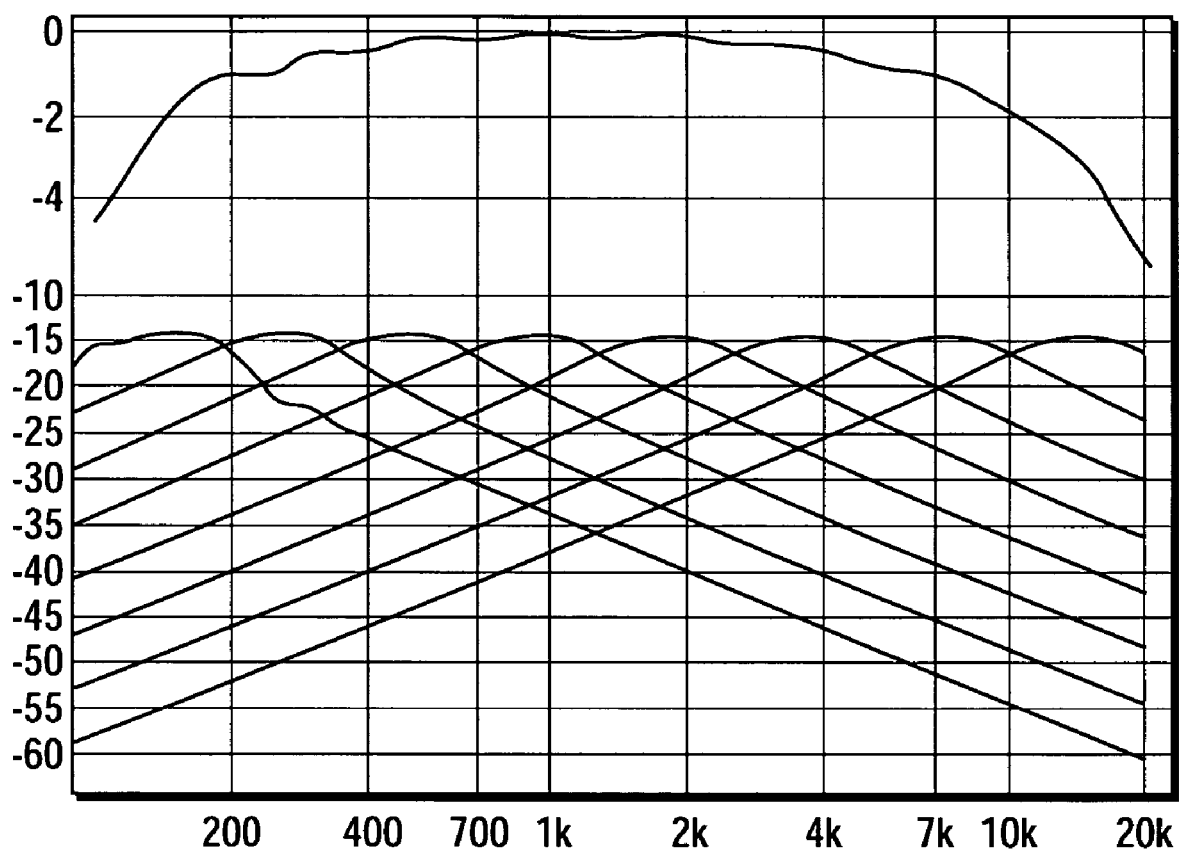
FIG. 3 is a graph shown to illustrate the output values of an eight channel equalizer configured according to the invention.

Referring to FIG. 3, a graph is shown to illustrate the output values of an eight channel equalizer configured according to the invention, such as that illustrated in FIGS. 1 and 2.

Figure 4:
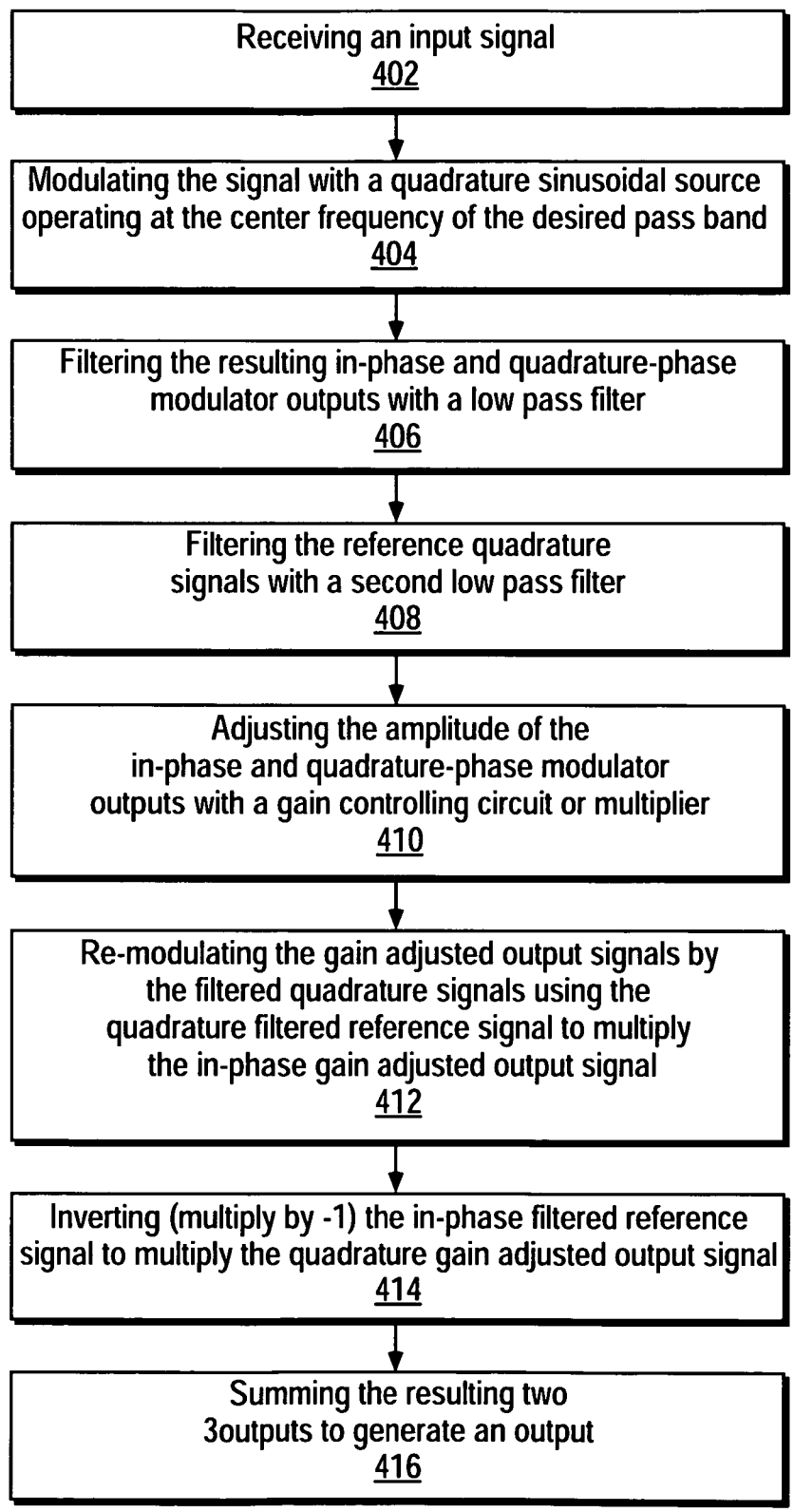
FIG. 4 is a flow diagram of a method configured according to the invention.

Referring to FIG. 4, a method 400 is illustrated according to the invention. In the first step 402, an input signal is received. It is modulated in step 404 with a quadrature sinusoidal source operating at the center frequency of the desired pass band. The resulting in-phase and quadrature-phase modulator outputs are then filtered with a low pass filter in step 406. A second low pass filter then filters the reference quadrature signals in step 408. A gain controlling circuit then adjusts the amplitude of the in-phase and quadrature-phase modulator outputs with a gain controlling circuit or multiplier in step 410. The process then re-modulates the gain adjusted output signals by the filtered quadrature signals using the quadrature filtered reference signal to multiply the in-phase gain adjusted output signal in step 412. The in-phase filtered reference signal is then inverted (multiplied by −1) to multiply the quadrature gain adjusted output signal in step 414. The resulting two outputs are then summed to generate an output in step 416.

In summary, the invention is a Stream Signal Processor built as a combination of eight elements, each element being a programmable band pass filter, each element having a band pass center frequency offset from the others and a programmable gain. The sum of the individual outputs of the eight elements is used to create the output signal. By adjusting the gain in each channel an eight channel equalizer is created.

The invention claimed is:

1. A signal processor comprising a plurality of channels, each channel configured to receive an input signal, each channel generating in-phase and quadrature-phase modulator outputs from the input signal and each channel having a plurality of low pass filters configured to filter the in-phase and quadrature-phase modulator outputs with at least a first low pass filter and to filter reference quadrature signals with at least a second low pass filter, and a gain control configured to re-modulate filtered gain adjusted output signals with the filtered reference quadrature signals, the processor including an inverter to invert the filtered in-phase reference signal to multiply the gain adjusted quadrature-phase output signal, and an output configured to output a modulated output signal.

2. A signal processor according to claim 1, wherein each channel includes an oscillator configured to establish a center of a bandpass of the channel.

3. A signal processor according to claim 1, wherein each channel includes a gain input configured to receive a gain signal used to attenuate the filtered in-phase and quadrature modulated output signals.

4. A method of processing an input signal by correlating the input signal with quadrature sources, comprising:

receiving an input signal and modulating the input signal with reference quadrature signals of a quadrature sinusoidal source operating at a center frequency of a desired pass band, filtering in-phase and quadrature-phase modulator outputs with at least a first low pass filter, filtering the reference quadrature signals with at least a second low pass filter, adjusting the amplitude of the filtered in-phase and quadrature-phase modulator outputs with a gain controlling circuit or multiplier, re-modulating the gain adjusted output signals by the filtered reference quadrature signals using the filtered quadrature-phase reference signal to multiply the gain adjusted in-phase output signal and using an inverted version of the filtered in-phase reference signal to multiply the gain adjusted quadrature-phase output signal, summing the resulting two outputs to generate an output.

* * * * *